United States Patent
Yeh et al.

(10) Patent No.: US 9,771,649 B2
(45) Date of Patent: Sep. 26, 2017

(54) SUBSTRATE CARRIER UNIT FOR A FILM DEPOSITION APPARATUS

(71) Applicant: Linco Technology Co., Ltd., Taichung (TW)

(72) Inventors: Chung-Yu Yeh, Taichung (TW); Huei-Chia Su, Taichung (TW); Cheng-Peng Yeh, Changhua (TW); Tsung-Wei Chang, Taichung (TW); Yi-Yuan Huang, Taichung (TW); Wan-Yu Huang, Keelung (TW); Mu-Sen Lu, Taichung (TW)

(73) Assignee: Linco Technology Co., Ltd., Taichung (TW)

( * ) Notice: Subject to any disclaimer, the term of this patent is extended or adjusted under 35 U.S.C. 154(b) by 167 days.

(21) Appl. No.: 14/704,422

(22) Filed: May 5, 2015

(65) Prior Publication Data
US 2016/0326637 A1 Nov. 10, 2016

(51) Int. Cl.
| | |
|---|---|
| *C23C 14/34* | (2006.01) |
| *C23C 14/50* | (2006.01) |
| *H01L 21/673* | (2006.01) |
| *H01L 21/677* | (2006.01) |
| *H01J 37/32* | (2006.01) |
| *C23C 14/54* | (2006.01) |
| *C23C 14/56* | (2006.01) |
| *H01J 37/34* | (2006.01) |

(52) U.S. Cl.
CPC ............ *C23C 14/50* (2013.01); *C23C 14/541* (2013.01); *C23C 14/568* (2013.01); *H01J 37/32715* (2013.01); *H01L 21/6776* (2013.01); *H01L 21/67336* (2013.01); *H01L 21/67346* (2013.01); *H01J 37/3411* (2013.01)

(58) Field of Classification Search
CPC ..................... H01J 37/32715; H01L 21/67336
See application file for complete search history.

(56) References Cited

U.S. PATENT DOCUMENTS

| | | | | |
|---|---|---|---|---|
| 4,607,266 | A * | 8/1986 | DeBonte | B41J 2/17593 347/88 |
| 6,686,598 | B1 | 2/2004 | Walther | |
| 2002/0144627 | A1* | 10/2002 | Doyle | C09D 11/34 106/31.61 |
| 2008/0121821 | A1 | 5/2008 | Muka et al. | |

OTHER PUBLICATIONS

Chinese Search Report in corresponding CN application No. 201510082576 dated Nov. 7, 2017 (4 pages).

\* cited by examiner

*Primary Examiner* — Jason M Berman
(74) *Attorney, Agent, or Firm* — Trop Pruner & Hu, P.C.

(57) ABSTRACT

A substrate carrier unit includes a substrate carrier and a phase transition material. The substrate carrier defines an isolated space therein. The phase transition material is filled into the isolated space of the substrate carrier and has a melting point ranging between 18° C. and 95° C. The phase transition material is capable of absorbing thermal energy from the substrate carrier as latent heat to change the phase from solid to liquid.

10 Claims, 6 Drawing Sheets

SUBSTRATE CARRIER UNIT FOR A FILM DEPOSITION APPARATUS

FIELD

The disclosure relates to a substrate carrier unit, and more particularly to a substrate carrier unit for a film deposition apparatus.

BACKGROUND

Recently, in-line sputtering apparatuses have been widely adopted in film deposition processes due to its various advantages, such as high yield, fast speed, good coating quality, lower manufacturing costs, etc. In general, a conventional sputtering apparatus includes at least three chambers: a feeding chamber, a deposition chamber and a discharge chamber. During the sputtering process, a substrate (that is to be deposited) is firstly disposed on a substrate carrier. The substrate carrier along with the substrate is disposed on a transport unit which is able to transport the substrate carrier along with the substrate into each of the chambers or among the chambers. The substrate is deposited with a film in the deposition chamber and is then discharged from the discharge chamber to obtain a deposited substrate (as a product). However, during the sputtering process, collisions between energetic ions and a target inside the deposition chamber creates a large amount of heat, causing the temperature inside the deposition chamber to be relatively high. Moreover, if a shortened deposition time and higher deposition efficiency is desired, the temperature in the deposition chamber would be further increased. This means that the temperature of the substrate carrier and the substrate in the deposition chamber are also increased. If the substrate carrier and the substrate cannot dissipate an adequate amount of heat in time, the high temperature may result in deformation or damage of the product, thereby adversely affecting the quality thereof.

Referring to FIG. 1, Taiwanese Patent No. I392756 discloses a conventional substrate carrier unit 1 for sputtering. The substrate carrier unit 1 includes a thermal conductive transport belt 13, a metal tray 12 that is disposed on the thermal conductive transport belt 13, and a substrate carrier 11 that is disposed on the metal tray 12 and that is for carrying a substrate (that is to be deposited) (not shown). The substrate carrier 11 has a bottom surface, and the metal tray 12 has a supporting surface. The supporting surface of the metal tray 12 defines a plurality of sawtooth projections 121, and the bottom surface of the substrate carrier 11 defines a plurality of grooves 111. When the substrate carrier 11 is disposed on the metal tray 12, the sawtooth projections 121 engage the grooves 111 so that the substrate carrier 11 and the metal tray 12 are thermally contacted with each other through a larger thermal contact area. As such, during the sputtering process, heat accumulated on the substrate, the deposited film on the substrate and the substrate carrier 11 can be conducted to the metal tray 12, and then be further conducted to the thermal conductive transport belt 13 to dissipate the heat. Although the metal tray 12 and the thermal conductive transport belt 13 both have high thermal conductivity to dissipate heat, the heat capacity of the metal tray 12 and the thermal conductive transport belt 13 are often not large enough, thereby limiting the heat dissipation efficiency of the conventional substrate carrier unit 1.

SUMMARY

Therefore, an object of the disclosure is to provide a substrate carrier unit for a film deposition apparatus that can alleviate at least one of the drawbacks of the prior arts.

According to the disclosure, a substrate carrier unit for a film deposition apparatus includes a substrate carrier and a phase transition material. The substrate carrier defines an isolated space therein. The phase transition material is filled into the isolated space of the substrate carrier and has a melting point ranging between 18° C. and 95° C. The phase transition material is capable of absorbing thermal energy from the substrate carrier as latent heat to change the phase from solid to liquid.

BRIEF DESCRIPTION OF THE DRAWINGS

Other features and advantages of the disclosure will become apparent in the following detailed description of the embodiments with reference to the accompanying drawings, of which.

DETAILED DESCRIPTION

The embodiment of a substrate carrier unit of this disclosure is used in a film deposition apparatus, e.g., is disposed on a transport unit of an in-line vacuum coating system (e.g., a sputtering system) such that the transport unit is able to carry the substrate carrier unit among a plurality of vacuum chambers in the in-line vacuum coating system.

Figure 1:
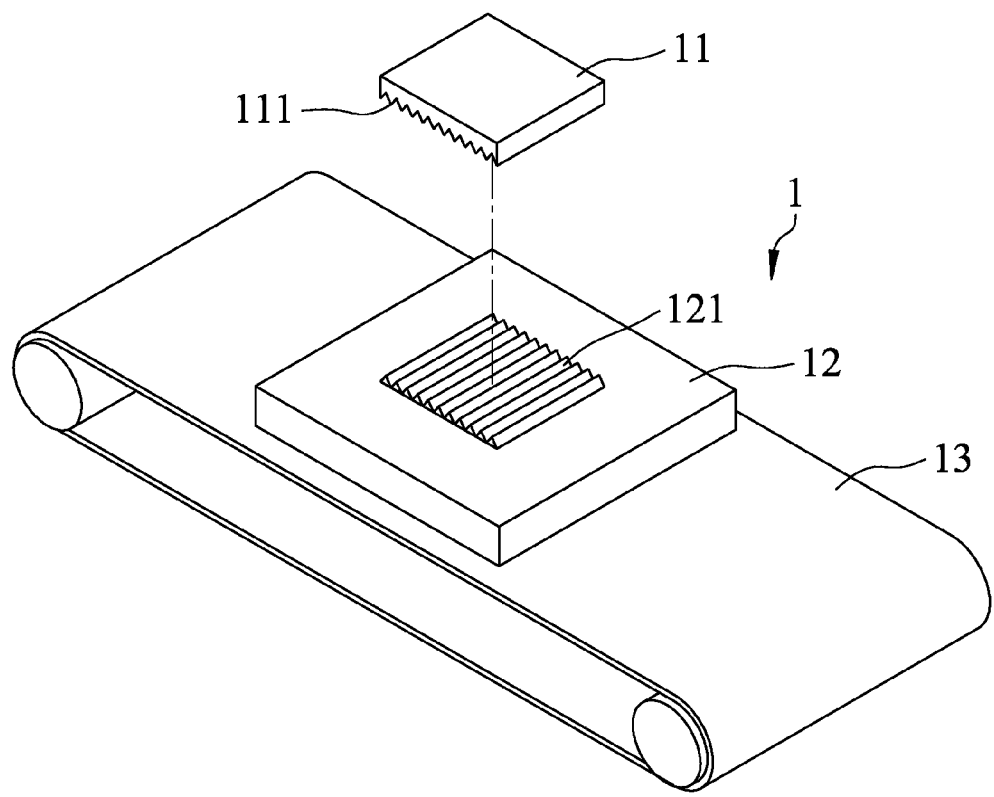
FIG. 1 is a partly exploded perspective view showing a conventional substrate carrier unit illustrated in Taiwanese Patent No. I392756.
Figure 2:
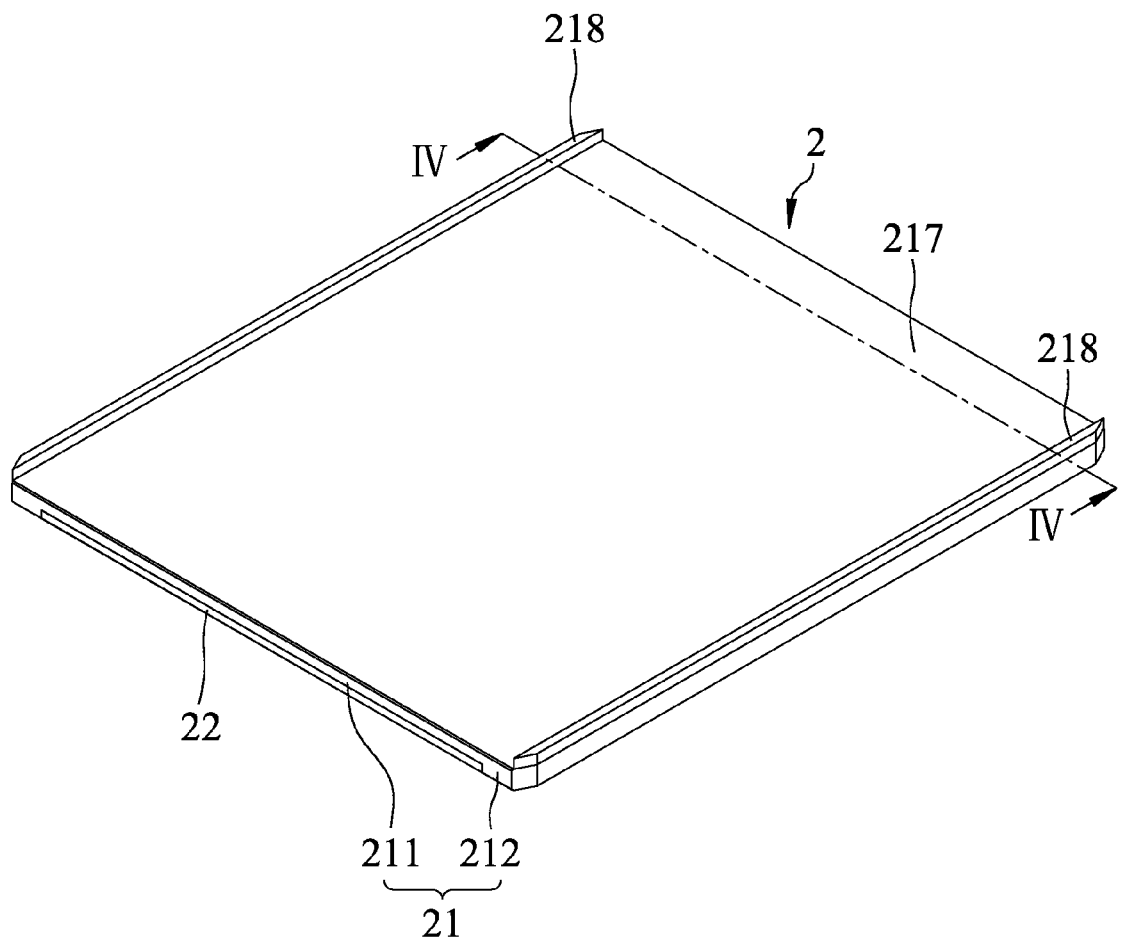
FIG. 2 an assembled perspective view of the embodiment of a substrate carrier unit for a film deposition apparatus according to the disclosure.
Figure 3:
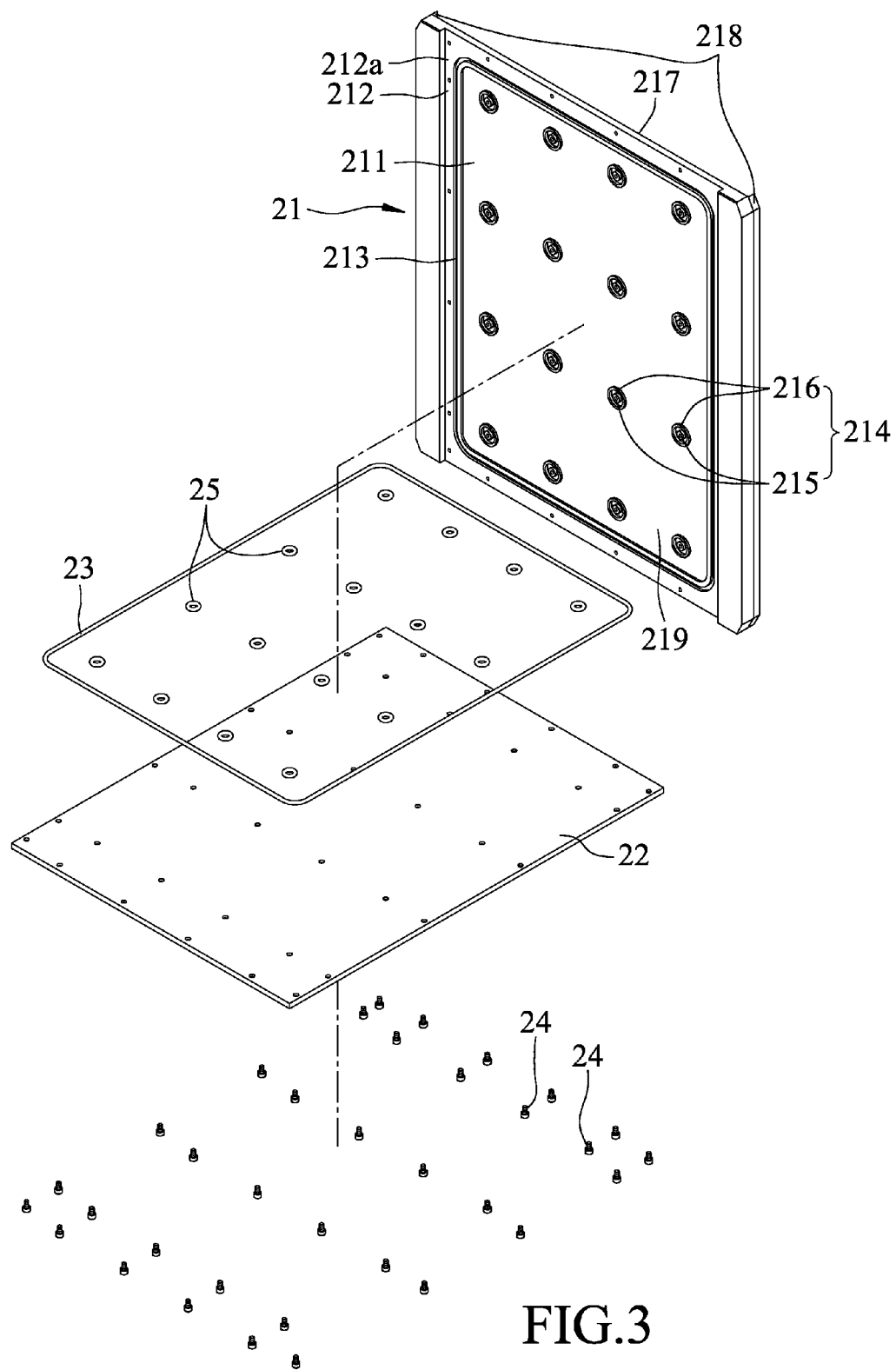
FIG. 3 is an exploded perspective view of the embodiment.
Figure 4:
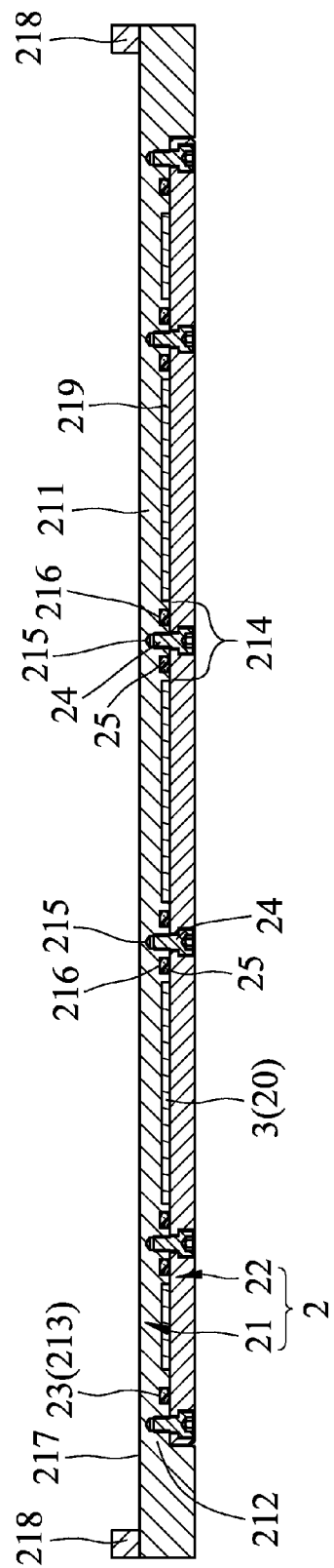
FIG. 4 is a cross-sectional view of the embodiment taken along line IV-IV in FIG. 2.

Referring to FIGS. 2 to 4, the substrate carrier unit includes a substrate carrier 2 and a phase transition material 3 (see FIG. 4).

The substrate carrier 2 defines an isolated space 20 therein and includes a base seat 21, a covering plate 22 and a first O-ring 23. The base seat 21 includes a base wall 211 and a surrounding wall 212 that surrounds the base wall 211, that perpendicularly protrudes from a periphery of the base wall 211, and that cooperates with the base wall 211 to define a recess. The covering plate 22 covers a surface 212a of the surrounding wall 212 to confine the recess so as to define the isolated space 20. The phase transition material 3 is filled into the isolated space 20. The surface 212a of the surrounding wall 212 is formed with a first annular groove 213. The first O-ring 23 is disposed in the first annular groove 213 and is clamped between the surrounding wall 212 and the covering plate 22 so as to prevent leakage of the phase transition material 3 out of the isolated space 20.

In this embodiment, the base seat 21 and the covering plate 22 are both made of an aluminum (Al) alloy. The phase transition material 3 is capable of absorbing thermal energy from the substrate carrier 2 as latent heat to change the phase from solid to liquid. In this embodiment, the phase transition material 3 has a melting point ranging between 18° C. and 95° C.

It should be noted that, when the phase transition material 3 absorbs thermal energy from the substrate carrier 2 and at least a part of the phase transition material 3 changes phase from solid to liquid, the total volume of the phase transition material 3 increases. In order to avoid damage or deformation of the substrate carrier 2 caused by the increased volume of the phase transition material 3, a volume of the isolated space 20 is equal to or greater than a volume of the phase transition material 3 in liquid phase. During the heat absorbing process, the phase transition material 3 has a heat storage capacity ranging from 134 (kJ/kg) to 250 (kJ/kg) and includes a phase transition from liquid to solid. The phase transition material 3 is one of an organic material and an inorganic material. In this embodiment, the organic material is a hydrocarbon. In some examples of the embodiment, the organic material may be an alkane. In certain examples of the embodiment, the organic material may be a $C_{16}$ to $C_{50}$ alkane, e.g., a wax of $C_{30}$ to $C_{50}$ alkane. In general, the phase transition material 3 in solid phase occupies 80% to 90% of a volume of the isolated space 20. It should be noted that when the aforesaid phase transition material 3 in solid phase melts into the liquid phase, the volume of the phase transition material 3 in liquid phase will not be greater than the volume of the isolated space 20.

The inorganic material is one of a hydrated salt ($M_nH_2O$) and a molten salt. To be more specific, examples of the hydrated salt are sodium sulfate decahydrate ($Na_2SO_4 \cdot 10H_2O$), sodium acetate trihydrate ($C_2H_3NaO_2 \cdot 3H_2O$), and ammonium aluminium sulfate dodecahydrate ($NH_4Al(SO_4)_2 \cdot 12H_2O$). Examples of the molten salt are sodium nitrate ($NaNO_3$) and potassium nitrate ($KNO_3$). In some embodiments of the disclosure, an additive is added to the hydrated salt to reduce the volume change of the hydrated salt when changing from solid phase to liquid phase.

When the phase transition material 3 absorbs thermal energy to change the phase from solid to liquid, if the distribution of the phase transition material 3 in the isolated space 20 is not uniform, the substrate carrier 2 may deform. In order to avoid the aforesaid drawback, in this embodiment, the substrate carrier 2 further includes a plurality of locking members 24 and a plurality of second O-rings 25. The base seat 21 further includes a plurality of protruding columns 214, each of which extends from a contact surface 219 of the base wall 211 to the covering plate 22 and is formed with an engaging hole 215 and a second annular groove 216 that surrounds the engaging hole 215. Each of the locking members 24 extends through the covering plate 22 to engage the engaging hole 215 of a respective one of the protruding columns 214. Each of the second O-rings 25 is disposed in the second annular groove 216 of a respective one of the protruding columns 214 and is clamped between the respective one of the protruding columns 214 and the covering plate 22.

During manufacture, in order to fill the phase transition material 3 into the isolated space 20, firstly, the base seat 21 is disposed in such a manner that the contact surface 217 faces upwardly. Secondly, the phase transition material 3 in powder form is melted into liquid. Then, the phase transition material 3 (in liquid phase) is filled into the recess defined by the base wall 211 and the surrounding wall 212 so as to cover the contact surface 219 of the base wall 211. Further on, each of the locking members 24 extends through the covering plate 22 to engage the engaging hole 215 of the respective one of the protruding columns 214 so that the base seat 21 is intimately connected to the covering plate 22 in such a manner that the first O-ring 23 is disposed in the first annular groove 213, and so that each of the second O-rings 25 is disposed in the second annular groove 216 of the respective one of the protruding columns 214. Finally, the phase transition material 3 is cooled to change the phase from liquid to solid to obtain the embodiment of the substrate carrier unit.

In this embodiment, the base seat 21 has a loading surface 217 that is distal from the covering plate 22, that is opposite to the contact surface 219, and that is for the substrate to be disposed thereon. It should be noted that, in order to firmly dispose the substrate on the loading surface 217, the base seat 21 further includes at least one limiting member 218 protruding from the loading surface 217 oppositely of the covering plate 22. To be more specific, in this embodiment, the base seat 21 includes two limiting members 218 protruding from the loading surface 217 and located on two opposite sides of the surrounding wall 212 (as best shown in FIG. 2) so as to limit movement of the substrate when the substrate is disposed on the loading surface 217. However, it should be understood that the limiting members 218 are not essential elements of this disclosure and can be omitted in other embodiments. Therefore, the configuration of the limiting members 218 should not be taken as a limitation to this disclosure. In other examples of the embodiment, the substrate may be adhered to the loading surface 217 by a thermal tape.

Figure 5:
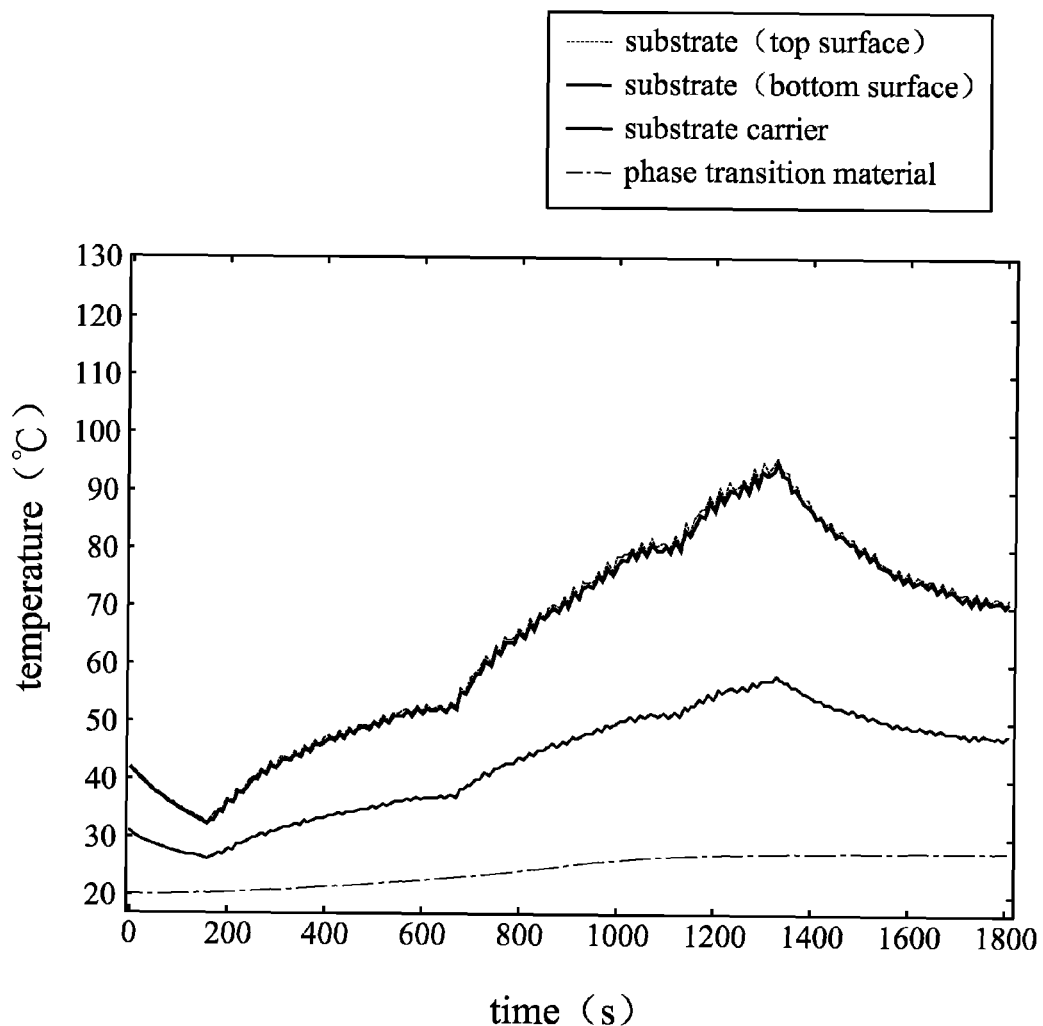
FIG. 5 is a simulation diagram of temperature versus time, showing temperature changes of a substrate, a substrate carrier and a phase transition material of the embodiment during a sputtering process.

FIG. 5 is a simulation diagram of temperature (° C.) versus time (sec) showing temperature changes of the embodiment and the substrate disposed thereon during a sputtering process. The temperature of a top surface of the substrate is measured by this experiment during the sputtering process to calculate radiant heat flux of a sputtering heat source. The radiant heat flux is then used as a boundary condition to obtain the temperature of a bottom surface of the substrate, the temperature of the substrate carrier 2 and the temperature of the phase transition material 3. In this simulation, the phase transition material 3 is octadecane ($C_{18}H_{38}$).

Figure 6:
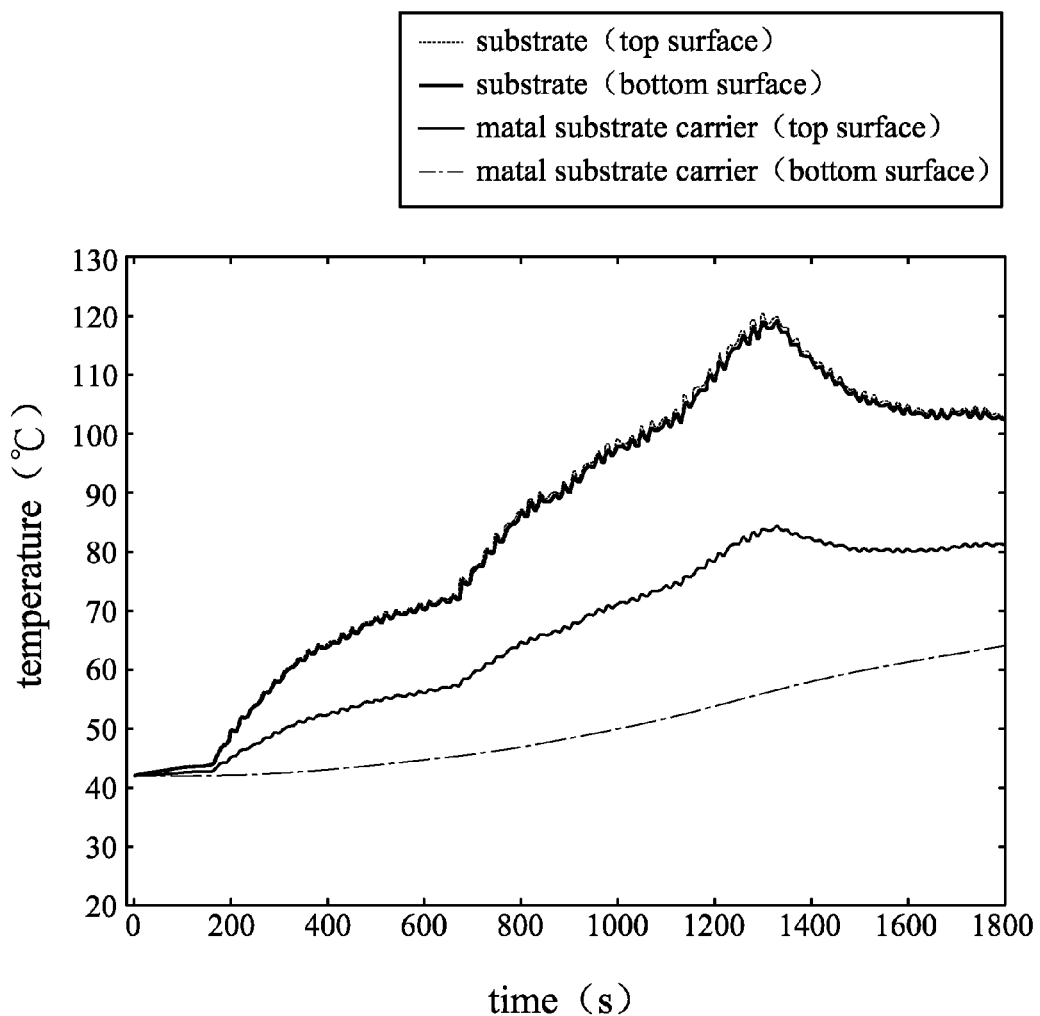
FIG. 6 is a simulation diagram of temperature versus time, showing temperature changes of a substrate and a conventional solid metal substrate carrier during a sputtering process.

FIG. 6 is a simulation diagram of temperature (° C.) versus time (sec) showing temperature changes of a conventional solid metal substrate carrier and the substrate disposed thereon during a sputtering process. The temperature of a top surface of the substrate is measured by the experiment during the sputtering process to calculate radiant heat flux of a sputtering heat source. The radiant heat flux is then used as a boundary condition to obtain the temperature of a bottom surface of the substrate and the temperature of the conventional solid metal substrate carrier. The phase transition material 3 in this simulation is octadecane ($C_{18}H_{38}$).

It should be noted that, plasma generated in the sputtering process causes a large amount of thermal energy to accumulate on the substrate. In this disclosure, the thermal energy on the substrate is conducted through the substrate carrier 2 to the phase transition material 3 so that the phase transition material 3 absorbs the thermal energy as latent heat to change the phase from solid to liquid. Compared to the conventional solid metal substrate carrier (FIG. 6), the phase transition material 3 (FIG. 5) can absorb a larger amount of heat from the substrate. Therefore, comparing FIG. 5 to FIG. 6, the maximum temperature of the top surface of the substrate disposed on the embodiment is about 95° C. (see FIG. 5), which is much lower than the maximum temperature (about 120° C.) of the top surface of the substrate disposed on the conventional solid metal substrate carrier (see FIG. 6). As a result, the phase transition material 3 having a larger heat capacity would significantly improve the thermal dissipation efficiency of the conventional substrate carrier. Therefore, the object of this disclosure can be achieved.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A substrate carrier unit for a film deposition apparatus, said substrate carrier unit comprising:
    a substrate carrier defining an isolated space therein; and
    a phase transition material filled into said isolated space of said substrate carrier and having a melting point ranging between 18° C. and 95° C., said phase transition material being capable of absorbing thermal energy from said substrate carrier as latent heat to change the phase from solid phase to liquid phase,
    wherein said substrate carrier includes a base seat and a covering plate, said base seat including a base wall and a surrounding wall that surrounds said base wall, that perpendicularly protrudes from a periphery of said base wall, and that cooperates with said base wall to define a recess, said covering plate covering a surface of said surrounding wall to confine said recess so as to define said isolated space,
    wherein said base seat further includes a plurality of protruding columns, each of which extends from said base wall to said covering plate and each of which is formed with an engaging hole, and
    wherein said substrate carrier further includes a plurality of locking members, each of which extends through said covering plate to engage said engaging hole of a respective one of said protruding columns.

2. The substrate carrier unit as claimed in claim 1, wherein said phase transition material is one of an organic material and an inorganic material.

3. The substrate carrier unit as claimed in claim 2, wherein said organic material is a $C_{16}$ to $C_{50}$ alkane.

4. The substrate carrier unit as claimed in claim 2, wherein said inorganic material is one of a hydrated salt and a molten salt.

5. The substrate carrier unit as claimed in claim 1, wherein a volume of said isolated space is equal to or greater than a volume of said phase transition material in liquid phase.

6. The substrate carrier unit as claimed in claim 1, wherein said phase transition material in solid phase occupies 80% to 90% of a volume of said isolated space.

7. The substrate carrier unit as claimed in claim 1, wherein, said surface of said surrounding wall is formed with a first annular groove, said substrate carrier further including a first O-ring that is disposed in said first annular groove and that is clamped between said surrounding wall and said covering plate.

8. The substrate carrier unit as claimed in claim 7, wherein:
    each of said protruding columns of said base seat is further formed with a second annular groove that surrounds said engaging hole of said protruding column;
    said substrate carrier further includes a plurality of second O-rings, each of which is disposed in said second annular groove of a respective one of said protruding columns, and each of which is clamped between the respective one of said protruding columns and said covering plate.

9. The substrate carrier unit as claimed in claim 8, wherein said base seat has a loading surface that is distal from said covering plate, said base seat further including at least one limiting member protruding from said loading surface oppositely of said covering plate.

10. The substrate carrier unit as claimed in claim 9, wherein said base seat includes two of said limiting members protruding from said loading surface and located on two opposite sides of said surrounding wall.

* * * * *